United States Patent
Kim et al.

(10) Patent No.: US 7,163,859 B2
(45) Date of Patent: Jan. 16, 2007

(54) METHOD OF MANUFACTURING CAPACITORS FOR SEMICONDUCTOR DEVICES

(75) Inventors: Dong-Woo Kim, Yongin (KR); Jae-Hee Oh, Seongnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/357,383

(22) Filed: Feb. 4, 2003

(65) Prior Publication Data

US 2003/0148581 A1 Aug. 7, 2003

(30) Foreign Application Priority Data

Feb. 5, 2002 (KR) ................................. 2002-6436

(51) Int. Cl.
*H01L 21/8242* (2006.01)
(52) U.S. Cl. ........................................ 438/253; 438/396
(58) Field of Classification Search ................ 438/240, 438/239, 243, 244, 353, 386, 387, 396
See application file for complete search history.

(56) References Cited

U.S. PATENT DOCUMENTS

| 5,300,801 | A  | * | 4/1994  | Blalock et al. | 257/309 |
| 5,760,474 | A  | * | 6/1998  | Schuele        | 257/754 |
| 5,895,250 | A  | * | 4/1999  | Wu             | 438/396 |
| 6,277,687 | B1 | * | 8/2001  | Agarwal        | 438/255 |
| 6,482,696 | B1 | * | 11/2002 | Park           | 438/253 |
| 6,583,021 | B1 | * | 6/2003  | Song           | 438/396 |
| 6,791,131 | B1 | * | 9/2004  | Fazan et al.   | 257/296 |

FOREIGN PATENT DOCUMENTS

| JP | 07-176584        | 7/1995  |
| KR | 2002-06436       | 10/1993 |
| KR | 0070847          | 10/1993 |
| KR | 2001-60565       | 7/2001  |
| KR | 10-2003-0048695 A | 6/2003 |

OTHER PUBLICATIONS

Korean Office Action Nov. 29, 2005 for Korean Application No. 10-2004-00312461 (English translation provided).

* cited by examiner

*Primary Examiner*—Hoai Pham
(74) *Attorney, Agent, or Firm*—Harness, Dickey & Pierce

(57) ABSTRACT

Capacitors for semiconductor devices and methods of fabricating such capacitors are provided. The disclosed capacitor comprises an interlayer dielectric layer (ILD) pattern having an opening exposing a portion of the underlying semiconductor substrate, a silicide pattern formed on the exposed substrate, and a lower electrode covering an inner wall and bottom of the opening. A dielectric layer is formed on the lower electrode, and an upper electrode is disposed on the dielectric layer. The dielectric layer preferably comprises a high k-dielectric layer such as tantalum oxide. The disclosed method comprises forming an ILD pattern with an opening that exposes a portion of a semiconductor substrate, forming an optional silicide pattern on the exposed substrate, forming a lower electrode on the inner wall of the opening, and sequentially forming a dielectric layer and an upper electrode on the resulting structure.

23 Claims, 7 Drawing Sheets

METHOD OF MANUFACTURING CAPACITORS FOR SEMICONDUCTOR DEVICES

RELATED APPLICATION

This application claims priority from Korean Patent Application No. 2002-06436, filed on Feb. 5, 2002, the contents of which are herein incorporated by reference in their entirety.

FIELD OF THE INVENTION

The present invention relates to semiconductor devices and methods of fabricating such devices. More specifically, the present invention is directed to semiconductor devices having utilizing a metal-insulator-metal (MIM) capacitor structure (hereinafter referred as an MIM capacitor), and methods of fabricating the same.

BACKGROUND OF THE INVENTION

To reduce fabrication costs of semiconductor devices, it is necessary to increase the level of integration of the semiconductor devices and minimize the number of fabricating steps. In the meantime, as portable electronic devices like cellular phones, camcorders, and game machines have become popular, a need for embedded memory logic (EML) semiconductor devices having both memories and logic circuits has been gradually increasing. In most such cases, the EML semiconductor devices incorporate DRAM elements as the memories for high-speed operations.

FIG. 1 is a cross-sectional view illustrating a method of fabricating a capacitor of a typical DRAM semiconductor device.

Referring to FIG. 1, a first interlayer dielectric layer (ILD) is formed on the semiconductor substrate 10. The first ILD is then patterned and etched to form a first interlayer dielectric pattern (ILD pattern) 20 with a first opening 25. The first opening 25 exposes a predetermined region of the semiconductor substrate 10. A conductive contact plug 30 is formed in the first opening 25 to contact the exposed region of the semiconductor substrate 10.

A second ILD is then formed on an entire surface of the semiconductor substrate including the contact plug 30. The second ILD is then patterned and etched to form a second ILD pattern 40 having a second opening 45. The second opening 45 exposes a top surface of the contact plug 30.

A lower electrode layer and a sacrificial layer (not shown) are formed on the entire surface of the semiconductor substrate including the second ILD pattern 40. Thereafter, an upper portion of the sacrificial layer and the lower electrode layer are etched to expose a top surface of the second ILD pattern 40 and leave a lower electrode 50 and a sacrificial pattern (not shown) filling the second opening 45. The sacrificial pattern is then removed to expose an inner wall of the lower electrode 50.

A dielectric layer 60 and an upper electrode layer are then sequentially formed on an entire surface of the semiconductor substrate including the exposed lower electrode 50. The upper electrode layer is then patterned and etched to expose a portion of a top surface of the dielectric layer 60 and form an upper electrode 70 that fills the remaining portion of the second opening 45.

Fabrication of a DRAM capacitor according to the conventional method comprises repeatedly performing a series of photolithographic and etching processes in order to form the first opening 25, the second opening 45, and the upper electrode 70. The present invention is directed to a method for decreasing the number of these photolithographic and etching processes to simplify the process and reduce the fabrication costs associated with producing such semiconductor devices.

In addition, a DRAM cell capacitor typically includes a lower electrode 50 having a height $h_1$ of at least about 10,000Å to realize highly integrated devices and secure a sufficient capacitance. However, as a result of the relatively extreme height $h_1$ of the lower electrode 50, DRAM fabrication processes are generally not compatible with those of more planar logic circuits. As a result, attempts to combine these processes makes it difficult to simplify the fabrication of EML semiconductor devices, and this may actually increase the fabrication costs and complexity.

SUMMARY OF THE INVENTION

The present invention provides capacitors for semiconductor devices that are both adequate for incorporation in EML semiconductor devices and may be produced more simply and/or less expensively.

The present invention also provides methods for fabricating capacitors for semiconductor devices that allow for fabricating EML semiconductor devices more simply and/or less expensively.

The present invention provides a capacitor for a semiconductor device that is disposed in an interlayer dielectric layer (ILD) covering a gate pattern and uses a high k-dielectric insulation layer as a capacitor dielectric layer. The capacitor comprises an interlayer dielectric layer (ILD) pattern disposed on a semiconductor substrate and having an opening exposing a top surface of the semiconductor substrate, a silicide pattern formed on the semiconductor substrate exposed through the opening, and a lower electrode covering an inner wall of the opening where the silicide pattern is formed. In addition, a dielectric layer covers an inner wall and a top surface of the lower electrode, and an upper electrode is disposed on at least a portion of the dielectric layer.

At this time, the silicide pattern is preferably composed of titanium silicide (TiSi) or cobalt silicide (CoSi), and the lower electrode is preferably composed of at least one conductive material selected from the group consisting of titanium nitride (TiN), tungsten (W), and ruthenium (Ru). Also, the dielectric layer is composed of at least one insulating material selected from the group consisting of tantalum oxide ($Ta_2O_5$), aluminum oxide ($Al_2O_3$), titanium oxide ($TiO_2$), silicon oxide ($SiO_2$), silicon nitride ($Si_3N_4$), hafnium oxide ($HfO_2$), BST (Barium Strontium Titanate), and PZT (Lead Zirconium Titanate).

Also, it is preferable that a heavily doped region is further disposed in the semiconductor substrate under the opening.

Another feature of the present invention can be achieved by a method of fabricating a capacitor of a semiconductor device that comprises forming a lower electrode of a capacitor in an ILD covering a gate pattern, such that the lower electrode of the capacitor contacts the semiconductor substrate. The method comprises forming an ILD pattern with an opening on a semiconductor substrate. The opening exposes a predetermined region of the semiconductor substrate. A silicide pattern is then formed on the exposed region of the semiconductor substrate. A lower electrode is formed to cover an inner wall of the opening where the suicide pattern is formed. Thereafter, a dielectric layer and an upper electrode layer are sequentially formed on the entire surface of the semiconductor substrate including the lower electrode.

Preferably, before forming the first ILD pattern, a heavily doped region is formed in the semiconductor substrate in a region below where the opening will be formed in the ILD.

Forming the silicide pattern comprises forming a metal layer, preferably titanium or cobalt, on the entire surface of the semiconductor substrate, including those regions of the exposed by openings in the ILD pattern, and heating the resulting structure to react the metal and silicon to form of the silicide pattern. Next, the unreacted portion of metal layer is removed, leaving the silicide pattern. The unreacted portion of the metal layer is preferably removed using an etch process having an etch selectivity with respect to the silicide pattern and the ILD pattern.

Forming the lower electrode comprises sequentially forming a lower electrode layer and a sacrificial layer on the entire surface of the semiconductor substrate where the silicide pattern is formed. The sacrificial layer and the lower electrode layer are then etched until a top surface of the ILD pattern is exposed, thereby forming a lower electrode and the sacrificial pattern filling the openings. The sacrificial pattern is then removed. The lower electrode is preferably formed from at least one conductive material selected from the group consisting of titanium nitride (TiN), tungsten (W), and ruthenium (Ru). Also, the sacrificial layer is preferably formed from at least one material selected from the group consisting of silicon oxide, SOG materials, and photoresist materials. The sacrificial pattern is preferably removed using an etch recipe having an etch selectivity with respect to the ILD pattern and the lower electrode. The sacrificial pattern may be removed using an isotropic etch process.

A dielectric layer and an upper electrode can then be formed on the lower electrode. The dielectric layer is preferably formed of at least one material selected from the group consisting of tantalum oxide ($Ta_2O_5$), aluminum oxide ($Al_2O_3$), titanium oxide ($TiO_2$), silicon oxide ($SiO_2$), silicon nitride ($Si_3N_4$), hafnium oxide ($HfO_2$), BST (Barium Strontium Titanate), and PZT (Lead Zirconium Titanate).

DESCRIPTION OF THE PREFERRED EMBODIMENT

Figure 1:
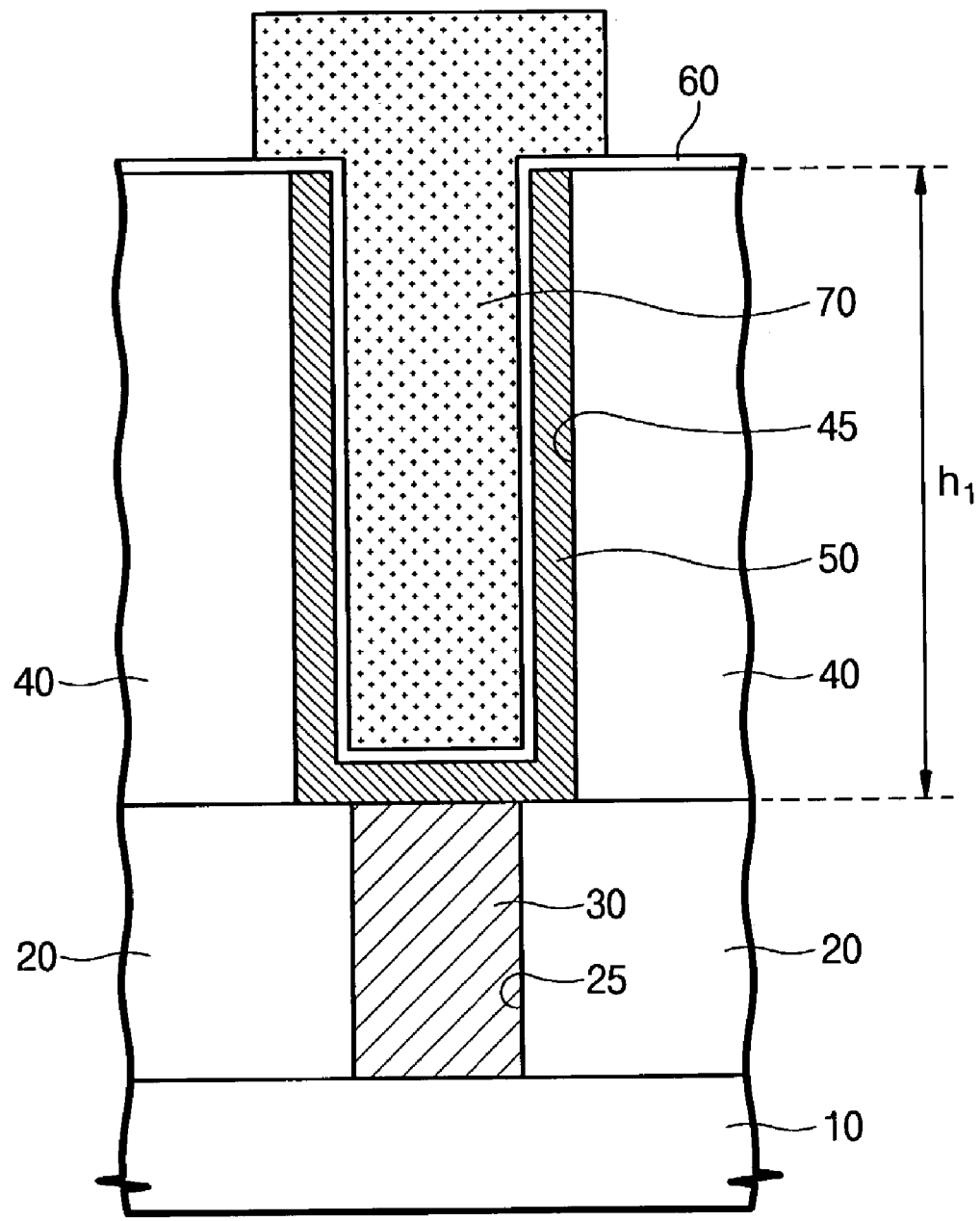
FIG. 1 is a cross-sectional view illustrating a method of fabricating a capacitor of a conventional DRAM semiconductor device.

The present invention is described more fully below with reference to the accompanying drawings in which preferred embodiments of the invention are shown. The invention may, however, be embodied in different forms and should not be construed as limited to the embodiments set forth or illustrated herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

The present invention relates to embedded memory logic (EML) semiconductor devices in which capacitors for logic circuits and cell capacitors for DRAMs comprise similar structures on a single device. As a result of similarities in the structures, the following description manufacture and structure of the DRAM of the cell capacitors may be applied to the capacitors formed for the corresponding logic circuits.

FIGS. 2 through 7 are cross-sectional views illustrating a method of fabricating a capacitor of a semiconductor device according to a first preferred embodiment of the present invention.

Figure 2:
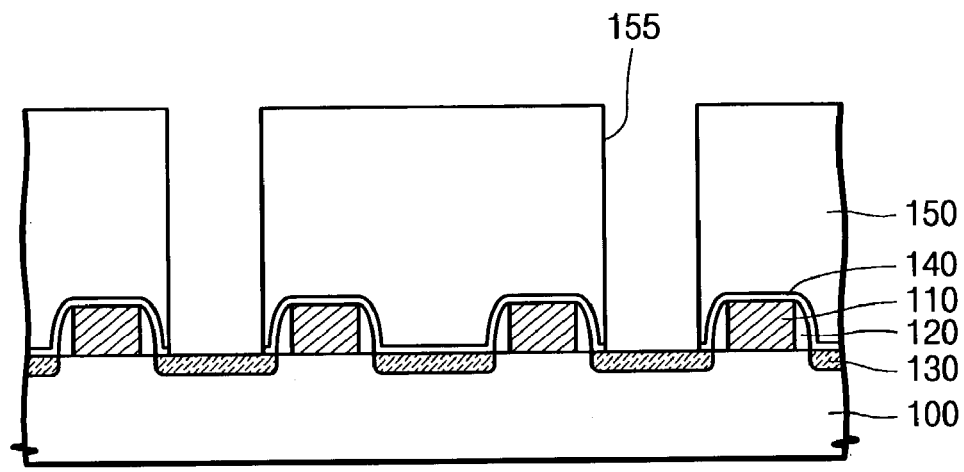
FIGS. 2 through 7 are cross-sectional views illustrating a method of fabricating a capacitor for a semiconductor device according to a first preferred embodiment of the present invention.

Referring to FIG. 2, a device isolation layer (not shown) is formed at a predetermined region of a semiconductor substrate 100 to define an active region. A gate pattern 110 is formed on the semiconductor substrate including the device isolation layer, and a spacer 120 is formed on a sidewall of the gate pattern 110. An ion implantation process is then conducted using the spacer 120 as a mask, to form a heavily doped region 130 in the active region. An etch stop layer and an ILD are then formed on the entire surface of the semiconductor substrate including the heavily doped region 130. Thereafter, the ILD and the etch stop layer are successively patterned and etched to form an ILD pattern 150 and an etch stop pattern 140, which have an opening 155. In this case, the opening 155 exposes a top surface of the heavily doped region 130.

The ILD pattern 150 is preferably formed from a silicon oxide layer. The etch stop pattern 140 is formed of a material having an etch selectivity (i.e., a lower etch rate) with respect to the material used to form the ILD pattern 150. The etch stop pattern 140 is preferably formed from a silicon nitride layer or a silicon oxynitride layer.

The etching process for forming the opening 155 preferably comprises etching the ILD using an etch recipe having an etch selectivity with respect to the etch stop layer. The etch stop layer is then etched using an etch recipe having an etch selectivity of at least 2:1 with respect to the semiconductor substrate 100.

Figure 3:
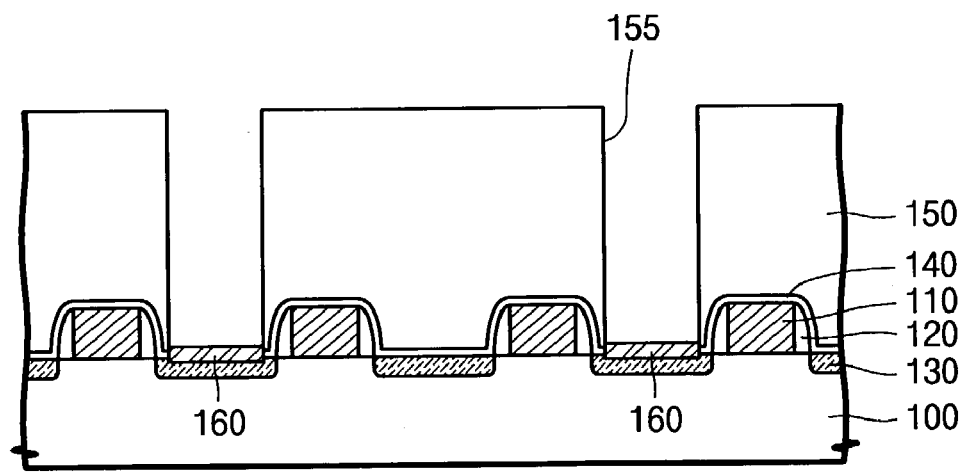

Referring to FIG. 3, a metal layer (not illustrated) is formed on the entire surface of the semiconductor substrate including the opening 155 and the top surface of region 130. Thereafter, a salicide (self-aligned silicide) process is performed to selectively form a silicide only where the metal layer is in contact with silicon. Thus, a silicide pattern 160 is formed on the regions of the semiconductor substrate 100 exposed by opening 155.

More specifically, the salicide process comprises applying a thermal process to the semiconductor substrate in contact with the metal layer. During the thermal process, metal atoms from the metal layer covering the silicon at the bottom of opening 155 react with silicon atoms from the semiconductor substrate 100 to form the silicide pattern 160. During this salicide process the portion of the metal layer which is not in contact with the semiconductor substrate 100 remains unreacted and does not form silicide. For example, the portion of the metal layer covering the ILD pattern 150 and the sidewalls of the opening 155 does not form silicide. After the thermal process, the unreacted portion of the metal layer is selectively removed leaving, as illustrated in FIG. 3, the silicide pattern 160 on the substrate at the bottom of the opening 155.

The metal layer is preferably formed of titanium (Ti) or cobalt (Co). The metal layer is preferably removed using an isotropic etch process with an etch recipe having an etch selectivity with respect to the materials used to form the ILD pattern 150 and the silicide pattern 160.

Figure 4:
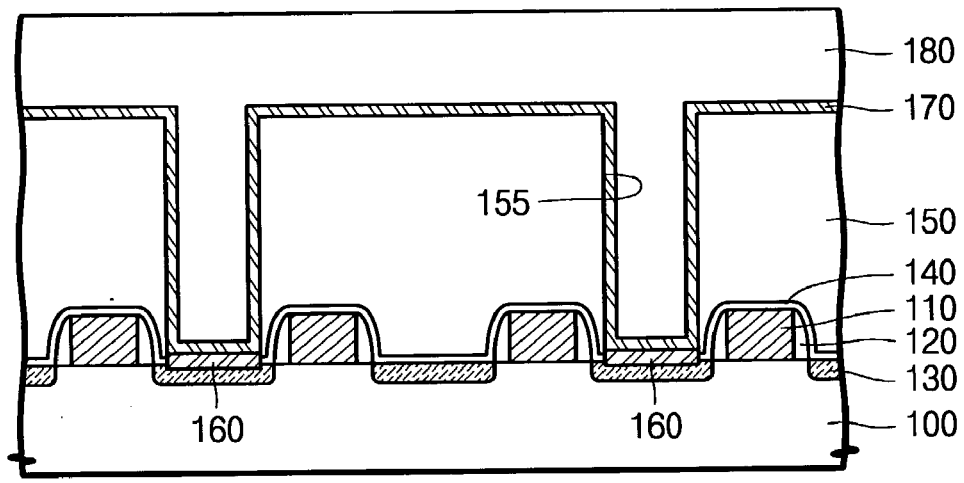

Referring to FIG. 4, a lower electrode layer 170 and a sacrificial layer 180 are sequentially formed on the entire surface of the semiconductor substrate including the silicide pattern 160.

To realize process simplification, the capacitor of the present invention includes the lower electrode formed in direct contact with the heavily doped region 130 without a contact plug 30 as illustrated in FIG. 1 and described in the Background of the Invention. The width of the opening 155 is preferably as narrow as possible so as to achieve a high level of integration of the semiconductor devices. As a result, the opening 155 has a high, e.g., at least about 10:1, aspect ratio. Thus, the lower electrode layer 170 is preferably formed of titanium nitride (TiN) or similar material that exhibits good step coverage characteristics. The titanium nitride (TiN) layer is preferably formed by chemical vapor deposition (CVD) or atomic layer deposition (ALD). If the titanium nitride layer is formed in direct contact with the heavily doped region 130, contact resistance may become excessive. According to the present invention, the silicide pattern 160 is formed to reduce or eliminate such contact resistance problems.

The sacrificial layer 180 is formed to facilitate subsequent planarizing processes. Thus, the sacrificial layer 180 preferably exhibits good gap-filling characteristics in order to fill the opening 155 completely despite the high aspect ratio described above. In addition, the sacrificial layer 180 is removed after the planarizing etch process, and this may cause the ILD pattern 150 to be recessed. Accordingly, the material used to form the sacrificial layer 180 should also exhibit a good etch selectivity with respect to the ILD pattern 150. For these reasons the sacrificial layer 180 is preferably formed of at least one material selected from silicon oxide with a high etch rate, SOG materials, and photoresist materials.

Figure 5:
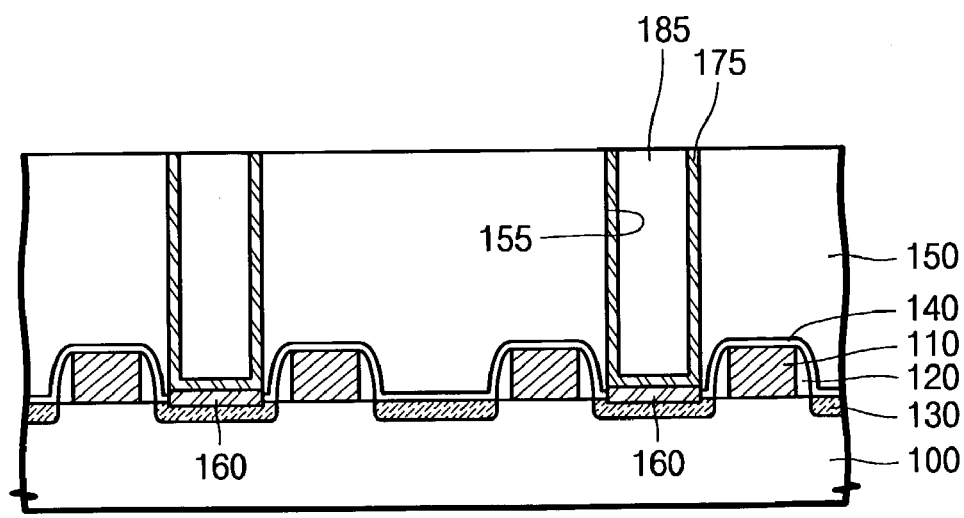

Referring to FIG. 5, a lower electrode separation process is performed to expose a top surface of the ILD pattern 150. Thus, the lower electrode layer 170 is etched to form a lower electrode 175 covering an inner wall of the opening 155 and contacting the silicide pattern. The sacrificial layer 180 is also etched during the lower electrode separation process to form a sacrificial pattern 185 that fills the space between portion of opening 155 the inner walls of the lower electrode 175.

The lower electrode separation process is preferably a planarizing etch process using chemical mechanical polishing (CMP). As a result, top surfaces of the lower electrode 175, the sacrificial pattern 185, and the ILD pattern 150 are exposed and planarized.

Figure 6:
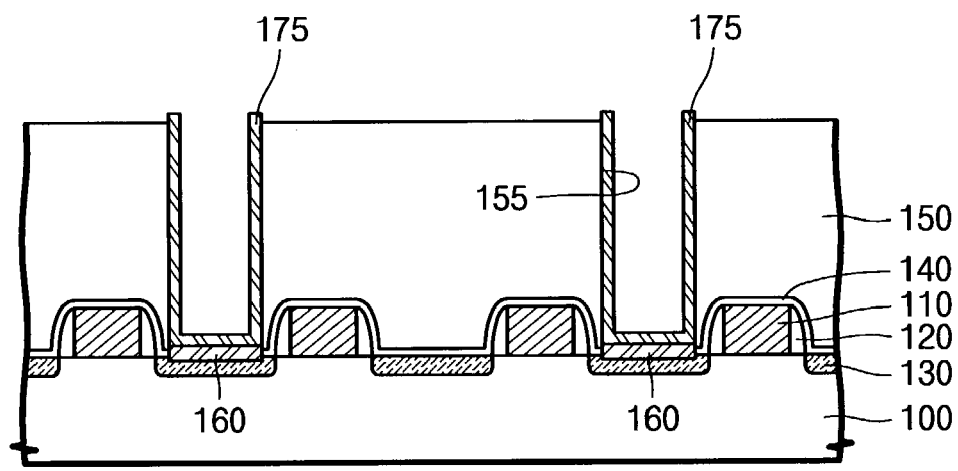

Referring to FIG. 6, the exposed sacrificial pattern 185 is then removed to expose the inner wall of the lower electrode 175. The sacrificial pattern 185 is preferably removed using an etch recipe having a good etch selectivity, i.e., a selectivity ratio of at least 10, with respect to both the lower electrode 175 and the ILD pattern 150. The sacrificial pattern 185 is preferably removed using an isotropic etch process and, more preferably, a wet etch process.

In general, the sacrificial pattern 185 has a nearly complete etch selectivity (e.g., a selectivity greater than about 20) with respect to the metal materials used to form the lower electrode 175. However, the sacrificial pattern 185 may not have a nearly complete etch selectivity with respect to the materials, such as oxide, used to form the ILD pattern 150. Thus, the surface of the ILD pattern 150 may become recessed while the sacrificial pattern 185 is being removed. As a result, the ILD pattern 150 may have a top surface lower than the upper portion of the lower electrode 175 as illustrated in FIG. 6.

Figure 7:
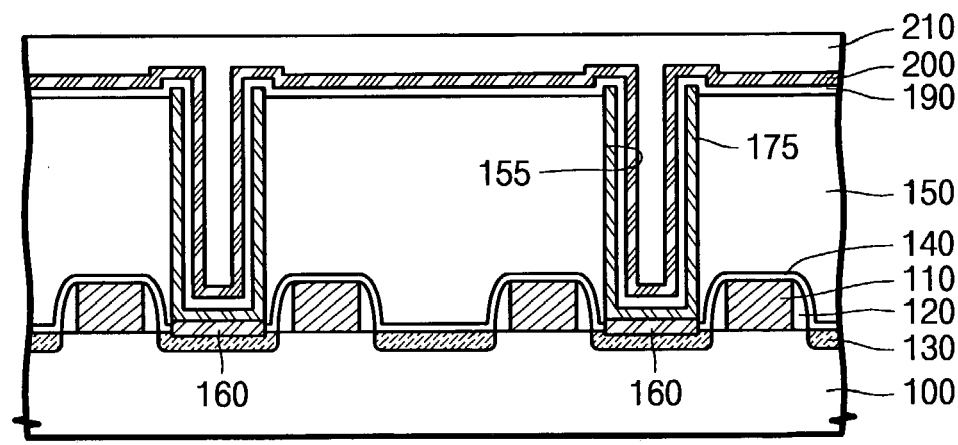

Referring to FIG. 7, a dielectric layer 190 and an upper electrode layer 200 are conformally formed on the entire surface of the semiconductor substrate after the sacrificial pattern 185 has been removed. Thereafter, a gap fill layer 210 is formed on the entire surface of the semiconductor substrate including the upper electrode layer 200.

The incompatibility of the processes for fabricating DRAMs and logic circuits, which is a problem in the conventional method, results from the high relative height of the DRAM cell capacitor. However, if the height of the DRAM cell capacitor is reduced in order to render the process more compatible with logic circuit structures, the surface area of the capacitor electrode is similarly reduced affecting the capacitance of the cell capacitor and increasing the likelihood of soft errors.

As is well known to those skilled in the art, the capacitance of a capacitor is proportional to the dielectric constant of a dielectric layer and the surface area of the capacitor electrode, and inversely proportional to the distance between capacitor electrodes. Thus, if the surface area of the capacitor electrode is reduced, the distance between the capacitor electrodes should be reduced and/or the capacitor dielectric layer should be formed from a material with a higher dielectric constant in order to maintain sufficient capacitance. However, techniques for reducing the distance between the capacitor electrodes have reached the technical limits due to an increase in a leakage current resulting from such reductions. For this reason, it is preferred that the capacitor dielectric layer be formed of a high-k dielectric material so that the height of the capacitor may be reduced while maintaining the necessary capacitance.

Thus, the dielectric layer 190 is preferably formed from at least one material selected from the group consisting of tantalum oxide ($Ta_2O_5$), aluminum oxide ($Al_2O_3$), titanium oxide ($TiO_2$), silicon oxide ($SiO_2$), silicon nitride ($Si_3N_4$), and hafnium oxide ($HfO_2$). Alternatively, the dielectric layer 190 may be formed of one material selected from the group consisting of $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, (BST), $Pb(Zr,Ti)O_3$, (PET) $(Pb,La)(Zr,Ti)O_3$, and $(Sr,Ca)RuO_3$.

The upper electrode 200 is preferably formed of at least one material selected from titanium nitride (TiN), titanium (Ti), cobalt (Co), tungsten (W), and ruthenium (Ru). Also, the gap fill layer 210 is formed to fill the remaining inner space of the opening 155 where the upper electrode 200 is formed. Preferably, the gap fill layer 210 is tungsten (W) or silicon oxide ($SiO_2$).

The gap fill layer 210 and the upper electrode layer 200 are then patterned and etched to form an upper electrode (not shown) and a gap fill pattern (not shown), which extend over the opening 155. In an alternative embodiment, the gap fill layer 210 may be formed after the upper electrode layer 200 has been patterned and etched.

Figure 8:
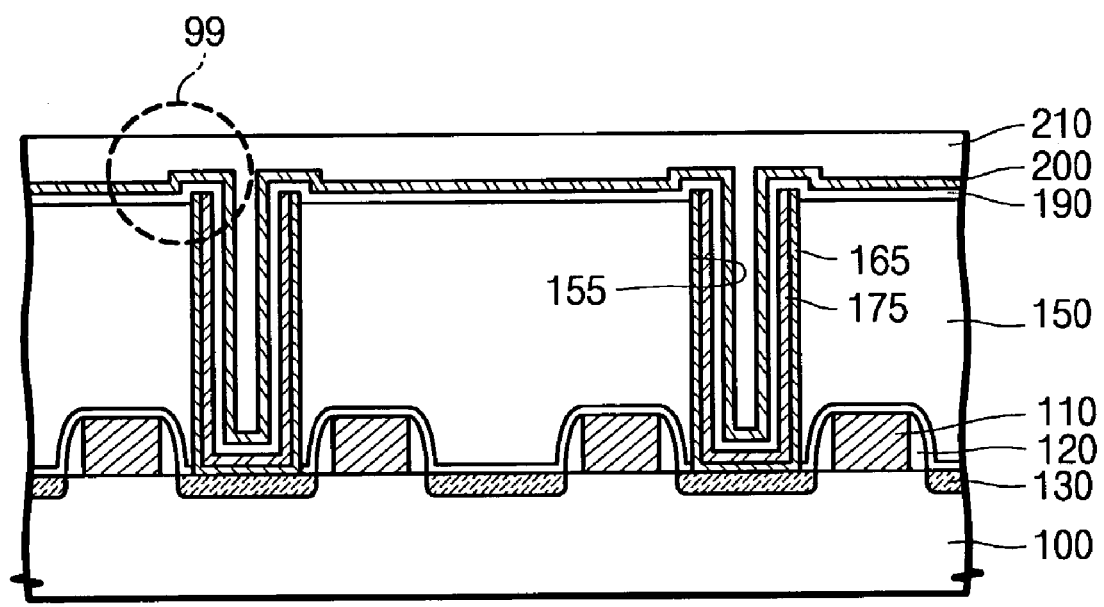
FIG. 8 is a cross-sectional view illustrating a method of fabricating a capacitor of a semiconductor device according to a second preferred embodiment of the present invention.

FIG. 8 is a cross-sectional view illustrating a method of fabricating a capacitor of a semiconductor device according to a second preferred embodiment of the present invention.

Since the second preferred embodiment includes fabricating steps in FIG. 2, the description of those steps will be omitted here for brevity.

Referring to FIGS. 2 and 8, after forming the ILD pattern 150 with the opening 155, a metal layer, a lower electrode layer, and a sacrificial layer are sequentially formed on the resultant structure. It is preferred that a rapid thermal process (RTP) is further performed after forming the metal layer, to produce an ohmic contact between the metal layer and the heavily doped region 130.

By performing the lower electrode separation process illustrated in FIG. 5 and described above, a metal pattern 165, a lower electrode 175, and a sacrificial pattern (not shown) are sequentially formed to fill the opening 155. Thereafter, the same fabricating steps illustrated in FIG. 6 and described above are performed to expose an inner wall of the lower electrode 175. Next, as described in FIG. 7, a dielectric layer 190, an upper electrode layer 200, and a gap fill layer 210 are sequentially formed on the entire surface of the resultant structure after the sacrificial pattern is removed.

In the second preferred embodiment, the salicide process illustrated in FIG. 3 and described above is omitted. Thus, the metal pattern 165 has a top surface higher than the ILD pattern 150 at top surface of the ILD pattern 150 (see 99). As illustrated in FIG. 8, because the metal pattern 165 is formed of titanium, the leakage current of the capacitor may increase.

Figure 9:
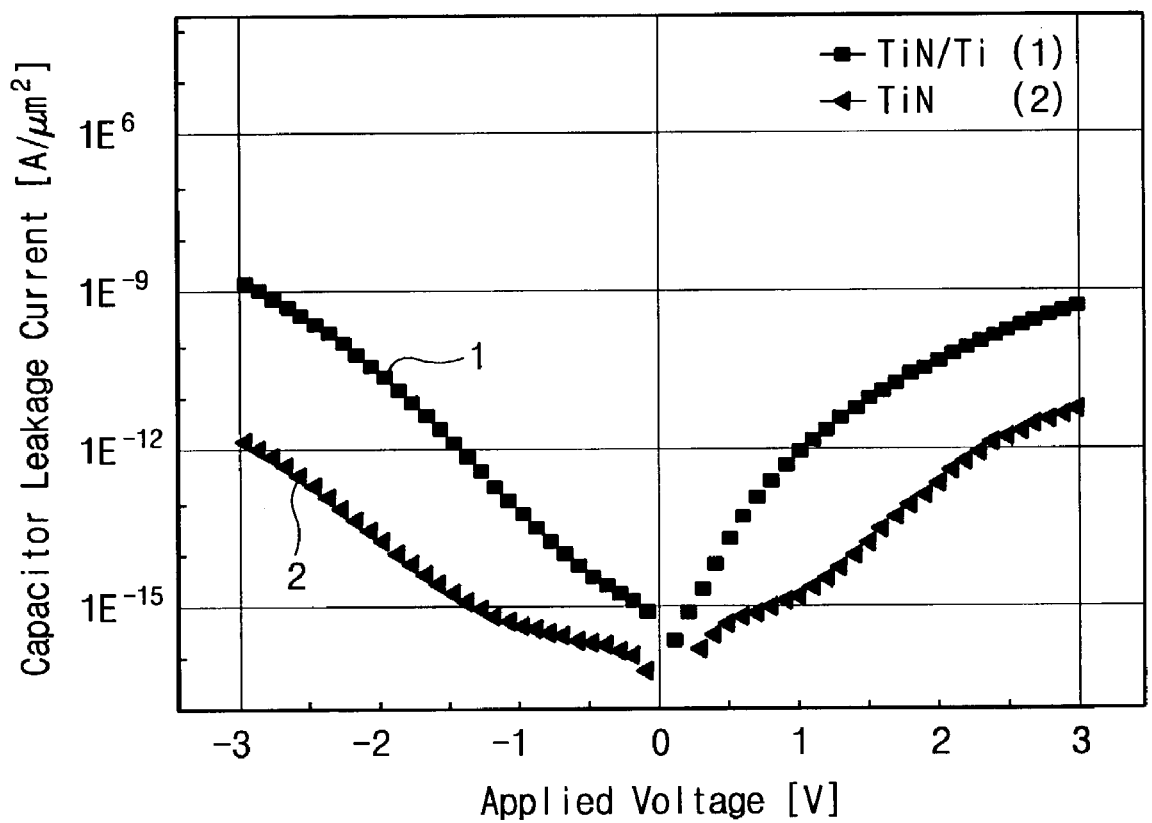
FIG. 9 is a graph showing leakage current characteristics of capacitors formed with varying lower electrode materials.

FIG. 9 is a graph showing the leakage current characteristics of the capacitor according to type of materials used to form lower electrode of the capacitor. Reference numeral 1 identifies the leakage current results of an experiment on the capacitor, in which the titanium layer has a top surface higher than the ILD pattern as illustrated in FIG. 8. Reference numeral 2 identifies the leakage current results of an experiment on the capacitor, in which the titanium layer is not exposed on the ILD pattern. The horizontal and vertical axes of the graph in FIG. 9 correspond to the applied voltages and the measured leakage currents, respectively.

Referring to FIG. 9, under an applied voltage of 1.0V, the leakage current 1 of the capacitor where the titanium layer is exposed on the ILD pattern 150 was measured to be about $10^{-12}$ A/$\mu m^2$. By comparison, under the same voltage conditions, the leakage current 2 of the capacitor where the titanium layer has a top surface lower than the ILD pattern 150 was measured to be about $10^{-15}$ A/$\mu m^2$. That is, the capacitor (corresponding to FIG. 7) where the titanium layer is not exposed enables the leakage current to be reduced more than, 1,000 times compared to the capacitor (corresponding to FIG. 8) where the titanium layer is exposed.

Consequently, the first preferred embodiment may minimize the leakage current more effectively than the second preferred embodiment.

Moreover, in both of the preferred embodiments of the present invention, a photolithographic etching process need be performed only twice to form the opening 155 and the upper electrode. In contrast, when a capacitor is formed according to the conventional method, a photolithographic etching process must be performed three times. The number of the photolithographic etching processes directly affects the fabrication costs. Therefore, the present invention has the advantage of markedly reducing fabrication costs when compared to the conventional method.

Figure 10:
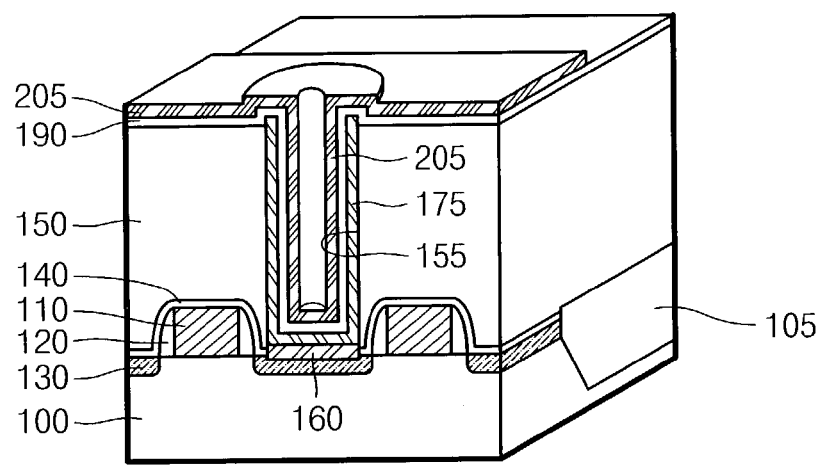
FIG. 10 is a perspective view illustrating the capacitor of the semiconductor device according to the first preferred embodiment of the present invention.
Figure 11:
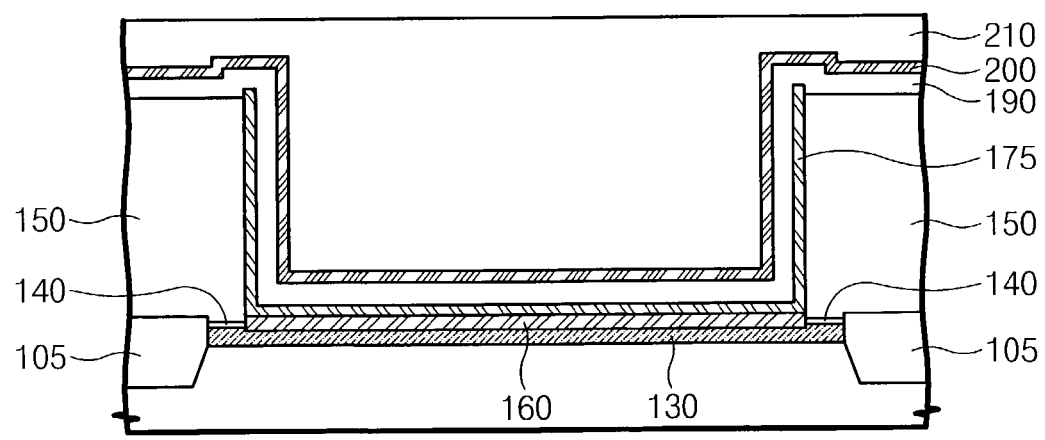
FIG. 11 is a cross-sectional view illustrating a capacitor according to an exemplary embodiment of the invention.

FIG. 10 is a perspective view illustrating the capacitor of the semiconductor device according to the first preferred embodiment of the present invention. Referring to FIG. 10, a device isolation layer 105 is disposed at a predetermined region of a semiconductor substrate 100 to define an active region. A gate pattern 110 is disposed on the active region to cross the device isolation layer 105 and the active region. Spacers 120 are disposed on both sidewalls of the gate pattern 110. A heavily doped region 130 is disposed in the active region between the spacers 120.

An ILD pattern 150, preferably silicon dioxide, with an opening 155 is disposed on the entire surface of the semiconductor substrate including the gate pattern 110 and the spacer 120. The opening 155 exposes a predetermined region of the heavily doped region 130. An etch stop pattern 140 is preferably disposed under the ILD pattern 150. The etch stop pattern 140 is preferably formed of a material that exhibits a good etch selectivity with respect to the material used to form the ILD pattern 150.

A silicide pattern 160 is disposed on the heavily doped region 130 under the opening 155. A lower electrode 175, a dielectric layer 190, and an upper electrode 205 are sequentially stacked on an inner wall of the opening 155 where the silicide pattern 160 is disposed. The upper electrode 205 and the dielectric layer 190 are extended from the inner wall of the opening 155 to cover the ILD pattern 150.

The silicide pattern 160 is preferably formed of titanium silicide or cobalt silicide. The lower electrode 175 is preferably formed of at least one material selected from the group consisting of titanium nitride (TiN), tungsten (W), and ruthenium (Ru).

The upper electrode 205 is preferably formed of at least one conducitve material selected from the group consisting of titanium nitride (TiN), titanium (Ti), cobalt (Co), tungsten (W), and ruthenium (Ru). The dielectric layer 190 is preferably formed from at least one insulating material selected from the group consisting of tantalum oxide ($Ta_2O_5$), an aluminum oxide ($Al_2O_3$), titanium oxide ($TiO_2$), silicon oxide layer ($SiO_2$), silicon nitride ($Si_3N_4$), hafnium oxide ($HfO_2$) material $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, (Ba,Sr)$TiO_3$ (BST), Pb(Zr,Ti)$O_3$ (PZT), (Pb,La)(Zr,Ti)$O_3$ and (Sr,Ca)$RuO_3$.

If the opening 155 is not completely filled with the upper electrode 205, a gap fill pattern (not shown) for filling the remainder of opening 155 may be used.

In the present invention, it is assumed that the cell capacitors for DRAMs and the capacitors for logic circuits exhibit the same basic structure, so descriptions are limited to the cell capacitors for DRAMs and methods of fabricating such capacitors. However, the dielectric layer of capacitors for logic circuits may be thicker than and/or formed from a different material then the dielectric used in a DRAM capacitor. Since such an alternative is believed apparent to those skilled in the art, a detailed description of this variation is considered unnecessary.

According to the present invention, a capacitor of a semiconductor device may be formed by performing a photolithographic etching process only twice. Thus, the present invention is more effective than conventional methods requiring the same basic processes to be performed three times. Also, according to the present invention, a capacitor dielectric layer may be formed from a high k-dielectric layer to maintain a desired capacitance level while lowering the height of the capacitor. As a result, embedded memory logic (EML) semiconductor devices having both logic circuits and DRAMs can be effectively fabricated using a simplified process.

What is claimed is:

1. A method of fabricating a capacitor on a semiconductor device comprising:

providing a semiconductor substrate;

forming an interlayer dielectric layer on the semiconductor substrate, the interlayer dielectric layer having a first etch rate $R_1$;

removing a portion of the interlayer dielectric layer to form an interlayer dielectric pattern, the interlayer dielectric pattern comprising an opening, the opening comprising an inner wall and an upper peripheral edge, and exposing a predetermined surface region of the semiconductor substrate;

forming a silicide pattern on the predetermined surface region of the semiconductor substrate;

forming a lower electrode layer on the interlayer dielectric pattern and the silicide pattern;

forming a sacrificial layer on the lower electrode layer, the sacrificial layer having a second etch rate $R_2$ that satisfies the relationship $R_2 > R_1$;

removing a portion of the sacrificial layer and the lower electrode layer formed on the interlayer dielectric pattern to expose an upper surface of the interlayer dielectric pattern, thereby forming a sacrificial pattern and a lower electrode; and removing the sacrificial pattern at the etch rate $R_2$ and a portion of the interlayer dielectric pattern at the etch rate $R_1$ to form a lower electrode substantially confined to the inner wall and within the upper peripheral edge, of the opening and the silicide pattern;

forming a dielectric layer on the lower electrode, the dielectric layer extending across the upper surface of the interlayer dielectric pattern; and forming an upper electrode layer on the dielectric layer.

2. A method of fabricating a capacitor on a semiconductor device according to claim 1, further comprising forming a heavily doped region in the predetermined region of semiconductor substrate, the heavily doped region being formed before forming the interlayer dielectric layer.

3. A method of fabricating a capacitor on a semiconductor device according to claim 1, wherein forming a silicide pattern on the predetermined surface region of the semiconductor substrate further comprises:

forming a metal layer on the interlayer dielectric pattern and the predetermined surface region of the semiconductor substrate;

heating the metal layer and the predetermined surface region of the semiconductor substrate to a temperature and for a time sufficient to react a first portion of the metal layer to form a silicide on the predetermined surface region of the semiconductor substrate; and removing an unreacted second portion of the metal layer while retaining a substantial portion of the silicide to form the silicide pattern.

4. A method of fabricating a capacitor on a semiconductor device according to claim 3, wherein the metal layer consists essentially of one metal selected from a group consisting of titanium and cobalt.

5. A method of fabricating a capacitor on a semiconductor device according to claim 3, wherein removing the unreacted second portion of the metal layer comprises removing substantially all of the metal layer formed on a top surface of the interlayer dielectric pattern and removing substantially all of the metal layer formed on the inner wall of the opening.

6. A method of fabricating a capacitor on a semiconductor device according to claim 1, wherein a ratio of the second etch rate $R_2$ to the first etch rate $R_1$ is at least 10.

7. A method of fabricating a capacitor on a semiconductor device according to claim 1, wherein the lower electrode comprises at least one conductive material selected from a group consisting of titanium nitride (TiN), tungsten (W), and ruthenium (Ru).

8. A method of fabricating a capacitor on a semiconductor device according to claim 1, wherein the sacrificial layer comprises at least one material selected from a group consisting of silicon oxide, SOG materials, and photoresist materials.

9. A method of fabricating a capacitor on a semiconductor device according to claim 1, wherein removing a portion of the sacrificial layer and the lower electrode layer formed on the interlayer dielectric pattern to expose an upper surface of the interlayer dielectric pattern further comprises chemical mechanical polishing (CMP).

10. A method of fabricating a capacitor on a semiconductor device according to claim 1, wherein substantially the entire sacrificial pattern is removed while retaining substantially all of the interlayer dielectric pattern and the lower electrode.

11. A method of fabricating a capacitor on a semiconductor device according to claim 10, wherein removing the sacrificial pattern comprises an isotropic etch process.

12. A method of fabricating a capacitor on a semiconductor device according to claim 1, wherein the dielectric layer is formed of at least one dielectric material selected from the group consisting of tantalum oxide, aluminum oxide, titanium oxide, silicon oxide, silicon nitride, haihium oxide, BST (Barium Strontium Titanate), and PZT (Lead Zirconium Titanate).

13. The method of claim 1, wherein the lower electrode is substantially confined to the inner wall of the opening and silicide pattern such that no appreciable portion of the lower electrode extends beyond a periphery of the opening.

14. A method of fabricating a capacitor on a semiconductor device comprising:

providing a semiconductor substrate;

forming a doped region in the semiconductor substrate;

forming an interlayer dielectric layer on the semiconductor substrate;

removing a portion of the interlayer dielectric layer to form an interlayer dielectric pattern, the interlayer dielectric pattern including an opening, the opening including an inner wall and an upper peripheral edge, and exposing a surface region of the doped region;

forming a silicide pattern on the predetermined surface region of the semiconductor substrate;

forming a lower electrode layer on the interlayer dielectric pattern and the silicide pattern;

forming a sacrificial layer on the lower electrode layer, the sacrificial layer having a second etch rate $R_2$ that satisfies the relationship $R_2 > R_1$;

removing a portion of the sacrificial layer and the lower electrode layer formed on the interlayer dielectric pattern to expose an upper surface of the interlayer dielectric pattern, thereby forming a sacrificial pattern and a lower electrode; and removing the sacrificial pattern at the etch rate $R_2$ and a portion of the interlayer dielectric pattern at the etch rate $R_1$ to form a lower electrode substantially confined to the inner wall and within the upper peripheral edge, of the opening and the silicide pattern;

forming a dielectric layer on the lower electrode, the dielectric layer extending across an upper surface of the interlayer dielectric pattern; and forming an upper electrode layer on the dielectric layer.

15. The method of claim 14, wherein the lower electrode is substantially confined to the inner wall of the opening and silicide pattern such that no appreciable portion of the lower electrode extends beyond a periphery of the opening.

16. A method of fabricating a capacitor on a semiconductor device according to claim 14, wherein a ratio of the second etch rate $R_2$ to the first etch rate $R_1$ is at least 10.

17. A method of fabricating a capacitor on a semiconductor device comprising:
provide a semiconductor substrate;
forming a doped region in the semiconductor substrate;
forming an interlayer dielectric layer on the semiconductor substrate;
removing a portion of the interlayer dielectric layer to form an interlayer dielectric pattern, the interlayer dielectric pattern including an opening, the opening including an inner wall and an upper peripheral edge, and exposing a surface region of the doped region;
forming a silicide pattern on the predetermined surface region of the semiconductor substrate;
forming a lower electrode layer on the interlayer dielectric pattern and the silicide pattern;
forming a sacrificial layer on the lower electrode layer, the sacrificial layer having a second etch rate $R_2$ that satisfies the relationship $R_2 > R_1$;
removing a portion of the sacrificial layer and the lower electrode layer formed on the interlayer dielectric pattern to expose an upper surface of the interlayer dielectric pattern, thereby forming a sacrificial pattern and a lower electrode; and
removing the sacrificial pattern at the etch rate $R_2$ and a portion of the interlayer dielectric pattern at the etch rate $R_1$ to form a lower electrode substantially confined to the inner wall and within the upper peripheral edge of the opening and the suicide pattern, an upper portion of the lower electrode extending above a plane defined by an upper surface of the interlayer dielectric pattern;
forming a dielectric layer on the lower electrode, the dielectric layer covering the upper portion of the lower electrode and extending across the upper surface of the interlayer dielectric pattern; and
forming an upper electrode layer on the dielectric layer.

18. A method of fabricating a capacitor on a semiconductor device according to claim 17, wherein a ratio of the second etch rate $R_2$ to the first etch rate $R_1$ is at least 10.

19. A method of fabricating a capacitor structure of an embedded memory and logic (EML) semiconductor device comprising:
forming an interlayer dielectric layer on a semiconductor substrate, the semiconductor substrate including a memory region and a logic region;
patterning the interlayer dielectric layer to form an interlayer dielectric pattern having a memory opening and a logic opening, the memory opening and the logic opening exposing top surfaces of the semiconductor substrate at the memory and logic regions, respectively;
forming silicide patterns on the top surfaces of the semiconductor substrate exposed by the memory opening and the logic opening;
sequentially forming a lower electrode layer and a sacrificial layer on the interlayer dielectric pattern, the lower electrode layer covering inner walls of the memory and logic openings and top surfaces of the silicide patterns, and the sacrificial layer filling the memory and logic openings having the lower electrode layer;
sequentially polishing the sacrificial layer and the lower electrode layer to expose a top surface of the interlayer dielectric pattern, thereby forming sacrificial patterns and lower electrodes;
removing the sacrificial patterns using a wet etch capable of removing the sacrificial patterns at a removal rate $R_S$ that is greater than a removal rate $R_I$ at which the interlayer dielectric pattern is removed to expose inner walls of the lower electrodes; and
sequentially forming a dielectric layer and an upper electrode layer on the interlayer dielectric pattern, the dielectric layer covering the inner walls of the lower electrodes.

20. The method of fabricating a capacitor structure of EML semiconductor device according to claim 19, wherein the lower electrodes are substantially confined to the memory and logic openings.

21. The method of fabricating a capacitor structure of EML semiconductor device according to claim 19, wherein the lower electrode layer comprises at least one conductive material selected from a group consisting of titanium nitride (TiN), tungsten (W), and ruthenium (Ru).

22. The method of fabricating a capacitor structure of EML semiconductor device according to claim 19, wherein the sacrificial layer comprises at least one material selected from the group consisting of silicon oxide, SOG materials, and photoresist materials.

23. The method of fabricating a capacitor structure of EML semiconductor device according to claim 19, wherein the dielectric layer is formed of at least one dielectric material selected from the group consisting of tantalum oxide, aluminum oxide, titanium oxide, silicon oxide, silicon nitride, haihium oxide, BST (Barium Strontium Titanate), and PZT (Lead Zirconium Titanate).

* * * * *